United States Patent
Park et al.

(10) Patent No.: US 7,382,668 B2
(45) Date of Patent: Jun. 3, 2008

(54) FULL-STRESS TESTABLE MEMORY DEVICE HAVING AN OPEN BIT LINE ARCHITECTURE AND METHOD OF TESTING THE SAME

(75) Inventors: Ki-Won Park, Gyeonggi-do (KR);
Hong-Sun Hwang, Gyeonggi-do (KR);
Sung-Ryul Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 78 days.

(21) Appl. No.: 11/319,247

(22) Filed: Dec. 27, 2005

(65) Prior Publication Data

US 2006/0181946 A1 Aug. 17, 2006

(30) Foreign Application Priority Data

Feb. 15, 2005 (KR) .................. 10-2005-0012262

(51) Int. Cl.
*G11C 7/00* (2006.01)

(52) U.S. Cl. .................. 365/201; 365/210; 365/63

(58) Field of Classification Search ............... 365/201, 365/210, 63
See application file for complete search history.

(56) References Cited

U.S. PATENT DOCUMENTS

| | | | |
|---|---|---|---|
| 6,459,634 | B1 | 10/2002 | Sher |
| 6,650,584 | B2 * | 11/2003 | Cowles .................. 365/201 |
| 6,898,113 | B2 * | 5/2005 | Tsuji .................... 365/158 |
| 2003/0058717 | A1 * | 3/2003 | Kawamoto et al. ...... 365/201 |

FOREIGN PATENT DOCUMENTS

| | | |
|---|---|---|
| JP | 6-12896 | 1/1994 |
| JP | 2002-231000 | 8/2002 |
| JP | 2003-109379 | 4/2003 |
| KR | 1998-066731 | 10/1998 |

OTHER PUBLICATIONS

English language abstract of Korean Publication No. 1998-066731.
English language abstract of Japanese Publication No. 6-12896.
English language abstract of Japanese Publication No. 2002-231000.
English language abstract of Japanese Publication No. 2003-109379.

* cited by examiner

*Primary Examiner*—Van Thu Nguyen
*Assistant Examiner*—Han Yang
(74) *Attorney, Agent, or Firm*—Marger Johnson & McCollom, P.C.

(57) ABSTRACT

A full-stress testable memory device having an open bit line architecture and a method of testing the memory device. The memory device of the invention includes dummy bit lines, and a voltage controller connected to the dummy bit lines. The voltage controller alternately provides a first variable control voltage and a second variable control voltage to the dummy bit lines during a test mode. In accordance with a method of testing the memory device, a fixed voltage is provided to the dummy bit lines of the edge sub-arrays during a normal operation mode. However, during a test mode, the fixed voltage being applied to the dummy bit line is replaced with a supply voltage and/or a ground voltage, so that all of the sub-arrays can be equally tested.

23 Claims, 9 Drawing Sheets

FULL-STRESS TESTABLE MEMORY DEVICE HAVING AN OPEN BIT LINE ARCHITECTURE AND METHOD OF TESTING THE SAME

CROSS-REFERENCE TO RELATED APPLICATION

The present application claims the priority of Korean Patent Application No. 2005-12262, filed 15 Feb. 2005 in the Korean Intellectual Property Office. The disclosures of all of the above applications are incorporated herein in their entirety by reference.

BACKGROUND OF THE INVENTION

1. Field of the Invention

This disclosure relates generally to memory devices, particularly memory devices having an open bit line architecture, and methods of testing memory devices.

2. Description of the Related Art

In general, in a memory device having an open bit line architecture, sense amplifiers are arranged between sub-arrays. Each of the sense amplifiers is connected to two bit lines, each of which is connected to the memory cells of an adjacent sub-array. However, some of the bit lines located in the sub-arrays at the edges of a memory array are not connected to sense amplifiers (hereinafter referred to as "dummy bit lines"). The dummy bit lines are connected to dummy memory cells.

In a memory device having an open bit line architecture, the bit lines of a sub array are interleaved with each other. One bit line of a sub-array is connected to a sense amplifier on one side of the sub-array, and an adjacent bit line is connected to another sense amplifier on the other side of the sub-array. However, edge sub-arrays have dummy bit lines that are interleaved with normal bit lines. Each of the dummy bit lines is arranged between two bit lines, and each of the normal bit lines is arranged between two dummy bit lines.

In a memory device having a conventional open bit line architecture illustrated in FIG. 1, dummy bit lines DUMMY are always connected to a fixed voltage (typically, VCC/2). A problem arises when a stress test is performed on the sub-arrays of a memory cell.

For example, a test pattern is applied to the memory cell during the test. The test pattern may be set such that it includes random data represented by different voltages such as a supply voltage VCC and a ground voltage VSS. For example, adjacent bit lines BIT and /BIT may be controlled by the supply voltage VCC and the ground voltage VSS, respectively. Writing a test pattern of supply voltage VCC and ground voltage VSS in memory cells during a test is similar to writing data having logic "1" and logic "0" in memory cells during a normal operation. In this manner, bit lines BIT and /BIT connected to a memory cell are controlled by opposite supply and ground voltages VCC and VSS. This stress test is applied to find defects between memory cells or bit lines.

However, in the memory device having a conventional open bit line architecture as illustrated in FIG. 1, dummy bit lines DUMMY are always connected to the voltage VCC/2. The voltage between the normal bit lines 31 of the edge sub-arrays 30 and the dummy bit lines DUMMY can only be controlled by the difference between the voltage VCC and the voltage VCC/2, or the voltage VSS and the voltage VCC/2. This implies that the memory cells or bit lines of the edge sub-arrays 30 undergo only half of the stress that the memory cells or bit lines of non-edge sub-arrays 50 undergo.

As a result, in memory devices having conventional open bit line architectures, the memory cells or the bit lines of the edge sub-arrays 30 are not fully stressed during a test. As a result, defects detectable in non-edge sub-arrays 50 may not be detected in the edge sub-arrays 30.

SUMMARY OF THE INVENTION

Embodiments of the invention include memory devices having open bit line architectures including dummy memory cells, dummy bit lines connected to the dummy memory cells where the dummy bit lines are connected to a fixed voltage during a normal operation mode, and a voltage controller connected to the dummy bit lines where the voltage controller provides a first variable control voltage and a second variable control voltage to the dummy bit lines during a test mode where the first variable control voltage and the second variable control voltage have levels that are different from the level of the fixed voltage.

BRIEF DESCRIPTION OF THE DRAWINGS

The above and other objects, features and advantages of the invention will be more clearly understood from the following detailed description taken in conjunction with the accompanying drawings, in which.

DESCRIPTION OF THE PREFERRED EMBODIMENTS

Figure 1:
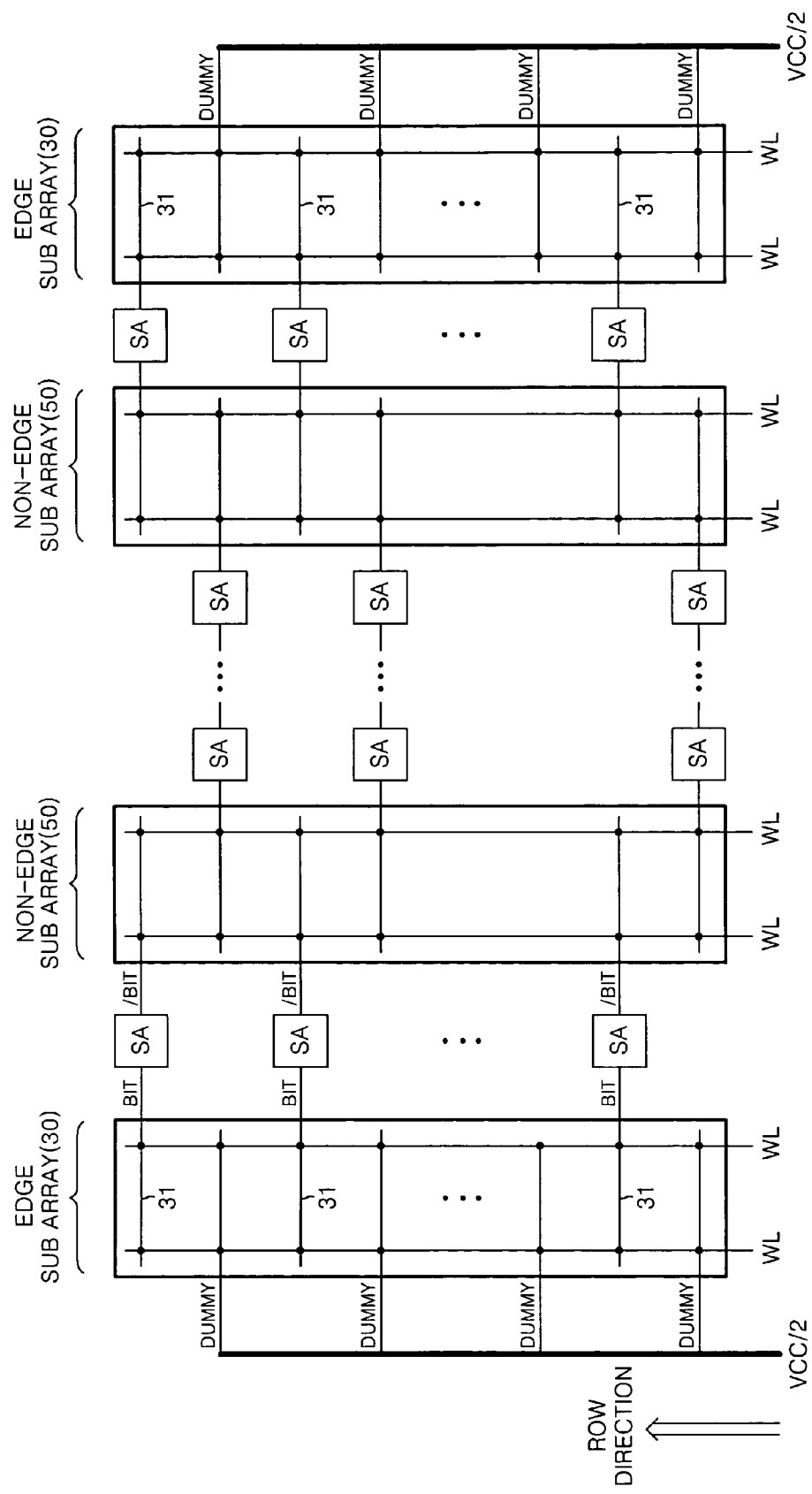
FIG. 1 is a diagram illustrating a memory device having a conventional open bit line architecture.

Reference now should be made to the drawings, in which the same reference numerals are used throughout the different drawings to designate the same or similar components. Embodiments are described in detail in conjunction with the accompanying drawings.

Figure 2:
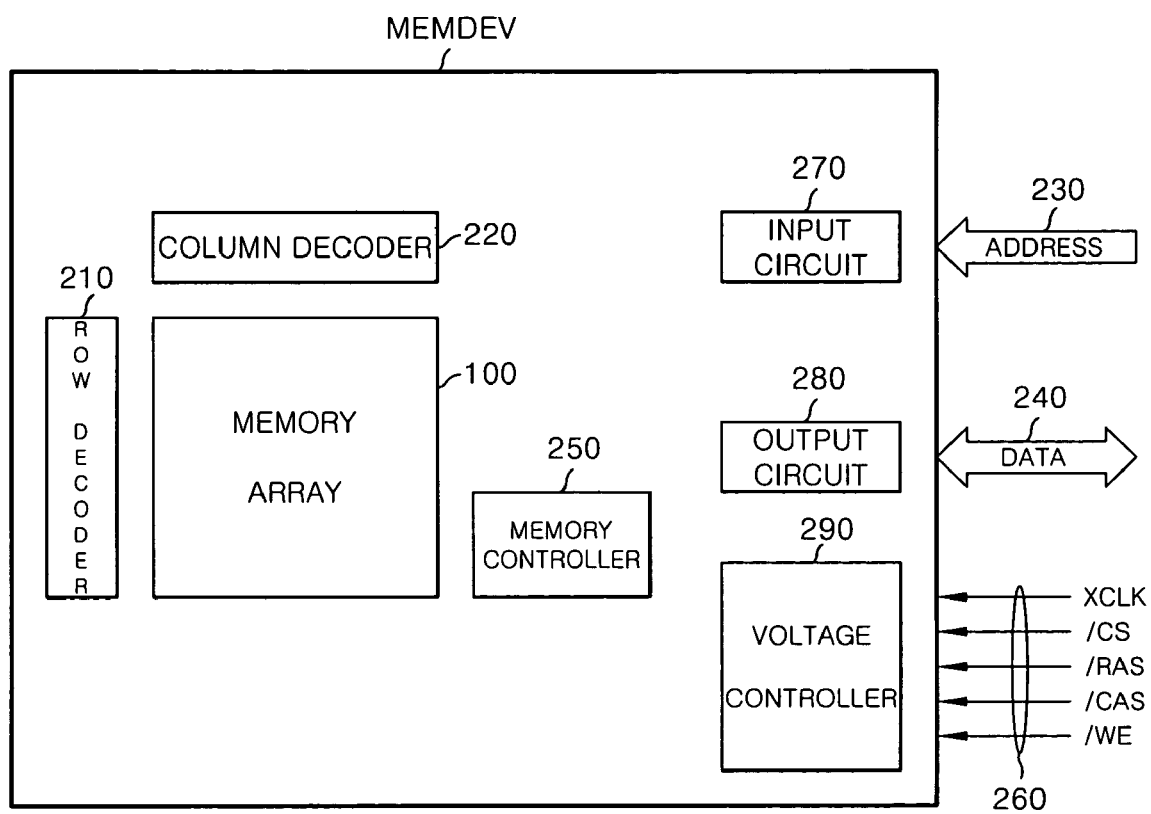
FIG. 2 is a block diagram illustrating a memory device having an open bit line architecture according to an embodiment of the invention.

FIG. 2 is a block diagram illustrating a memory device MEMDEV having an open bit line architecture according to an embodiment. The memory device MEMDEV includes a memory array 100. The memory array 100 includes memory cells which are arranged in rows and columns. A row decoder 210 and a column decoder 220 access rows and columns corresponding to addresses provided through address lines 230. Data are transmitted and received to and from the memory device MEMDEV via data lines 240. A memory controller 250 controls data communication to and from the memory device MEMDEV. In this case, the data communication is performed through an input circuit 270 and an output circuit 280 in response to input signals on the control lines 260. The memory controller 250 receives input signals through the control lines 260, and determines the operation mode of the memory device MEMDEV, including a read, write, or test mode. The input signals on the lines 260 include External Clock XCLK, Row Access Strobe /RAS, Column Access Strobe /CAS and Write Enable /WE, but are not limited to these signals.

The memory device MEMDEV further includes a voltage controller 290. The voltage controller 290 provides a fixed voltage during the normal operation of the memory device MEMDEV. The fixed voltage is applied to a voltage bus that is connected to dummy bit lines. The voltage controller 290 replaces the fixed voltage with first variable voltage and second variable voltage during a test operation. The first variable voltage and the second variable voltage allow all of the memory cells of the memory array 100 to be substantially and equally stressed during a test.

The memory device MEMDEV of FIG. 2 may be a Dynamic Random Access Memory (DRAM), or another type of memory, such as Static Random Access Memory (SRAM) or flash memory. Furthermore, the DRAM may be a synchronous type DRAM, such as Synchronous Graphics Random Access Memory (SGRAM), Synchronous Dynamic Random Access Memory (SDRAM) or SGRAM II, Double Data Rate Static DRAM (DDR SDRAM), as well as DRAM sold under the trademark Synchlink or Rambus. FIG. 2, describing the memory device MEMDEV, is simplified to represent an embodiment of the invention. It is readily apparent to those skilled in the art that the drawing does not illustrate all of the characteristics of the memory device in detail.

Figure 3:
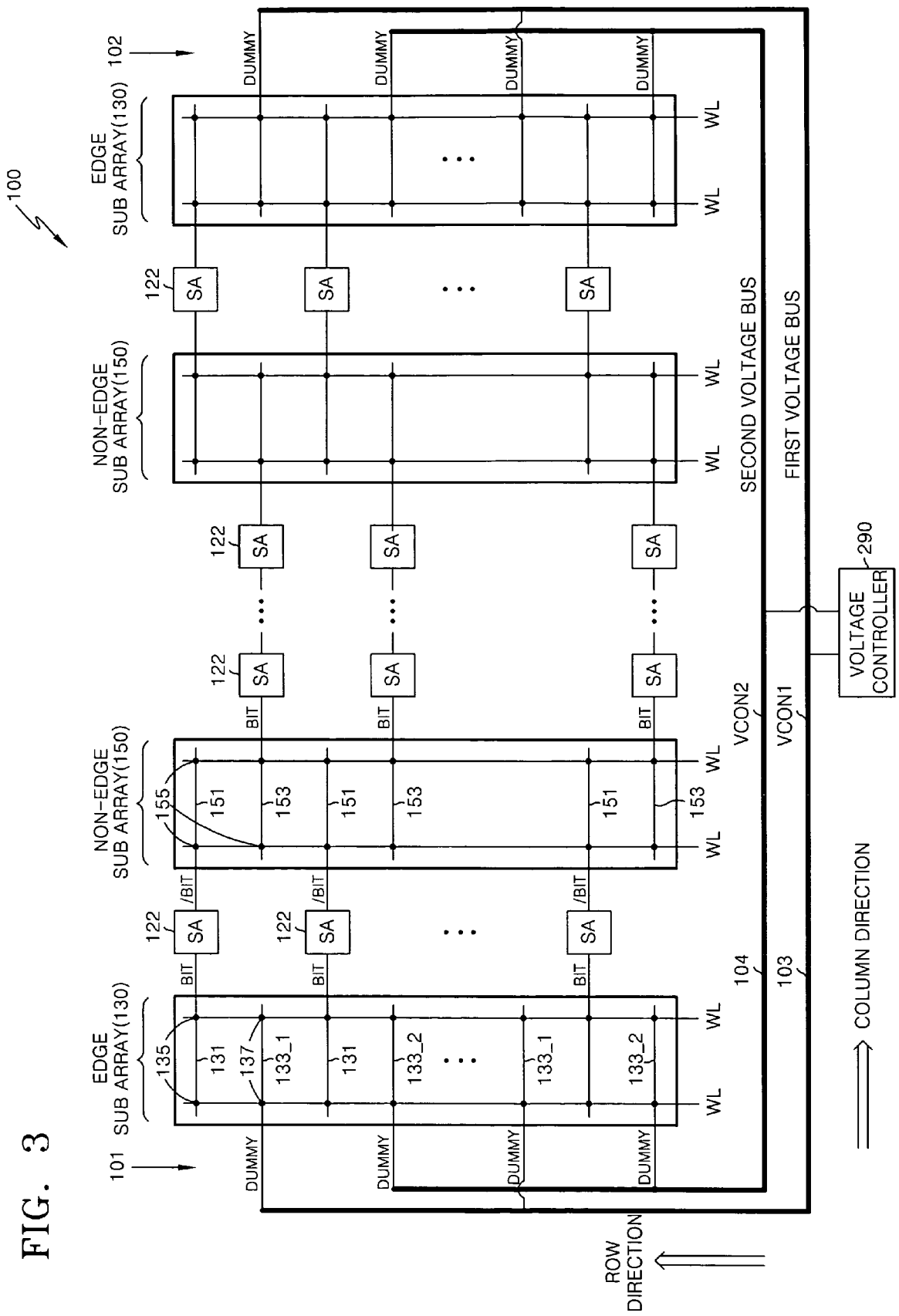
FIG. 3 is a diagram illustrating a part of the memory array and the voltage controller of the memory device of FIG. 2.

FIG. 3 is a diagram illustrating part of the memory array 100 connected to the voltage controller 290 of FIG. 2. As illustrated in FIG. 3, the memory array 100 includes non-edge sub-arrays 150 and edge sub-arrays 130. For simplicity, only two non-edge sub-arrays 150 are illustrated in FIG. 3. The sub-arrays 130 and 150 are arranged in a single direction. The arrangement extends from a first edge 101 to a second edge 102. The edge sub-arrays 130 are located at the first edge 101 and the second edge 102. The non-edge sub-arrays 150 are interposed between the edge sub-arrays 130. In FIG. 3, the memory array 100 is simplified, so that the non-edge sub-arrays 150 and the edge sub-arrays 130 are illustrated as arranged in a single direction. However, in other embodiments, the memory array 100 may include edges between the first edge 101 and the second edge 102. In these embodiments, the total number of edge sub-arrays is greater than 2.

The memory array 100 includes memory cells 135, 137 and 155, which are indicated by dots in FIG. 3. The memory array 100 has an open bit line architecture where the memory cells are located at the intersections of rows and columns. In FIG. 3, the row and column directions are indicated by arrows. Furthermore, the memory cells in the same column are connected to the same bit line BIT or /BIT. The memory cells in the same row are connected to the same word line WL. The bit lines are interleaved with each other, and an activated word line WL traverses the memory cells located on respective bit lines BIT and /BIT. The memory cells 135 are 155 are normal memory cells used for the operation of the memory array 100 to store data bits.

The memory array 100 further includes sense amplifiers 122 and bit lines 131, 133_1, 133_2, 151 and 153. The bit lines 131, 151 and 153 are normal bit lines connecting the normal memory cells 135 and 155 to the sense amplifiers 122 located between the sub-arrays 130 and 150. The bit lines 133_1 and 133_2 are dummy bit lines connected to a voltage controller 290 via first and second voltage buses 103 and 104. A voltage VCON1 applied to the bit line 133_1 may be a first variable control voltage, and a voltage VCON2 applied to the bit line 133_2 may be a second variable control voltage.

The memory array 100 of FIG. 3 has an open bit line architecture in which bit lines are interleaved with each other. The two adjacent bit lines of the same sub-array are connected to different sense amplifiers. For example, the bit line 151 of the sub-array 150 is connected to one sense amplifier 122, whereas the adjacent bit line 153 of the same sub-array 150 is connected to another sense amplifier 122. Similarly, in the edge sub-array 130, the dummy bit lines 133_1 and 133_2 are also interleaved with the normal bit lines 131. Each of the dummy bit lines 133_1 and 133_2 is adjacent to two normal bit lines 131, whereas each of the normal bit lines 131 is adjacent to two dummy bit lines 133_1 and 133_2.

Figure 4:
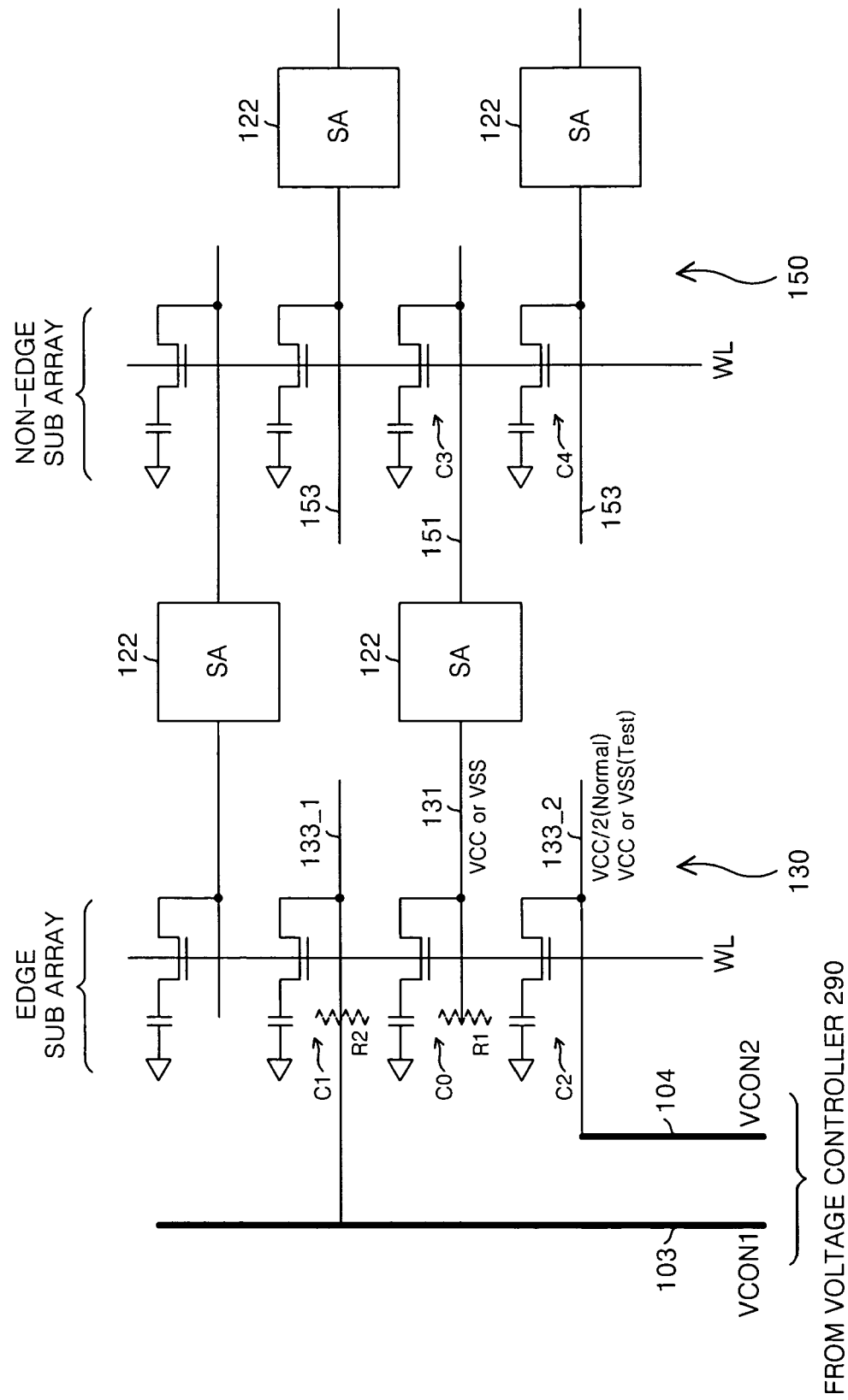
FIG. 4 illustrates a portion of the memory array of FIG. 3 in more detail.

FIG. 4 illustrates a portion of the memory array 100 of FIG. 3 in more detail. In FIG. 4, reference character C0 designates a normal memory cell similar to the memory cell 135 of FIG. 3. Reference characters C1 and C2 designate dummy memory cells similar to the memory cells 137 of FIG. 3. Reference characters C3 and C4 designate normal memory cells similar to the memory cells 155 of FIG. 3. The memory cells C0, C1 and C2 are memory cells that are included in an edge sub-array 130. The memory cells C3 and C4 are memory cells that are included in a non-edge sub-array 150. The memory cells C0 and C3 are respectively located on bit lines 131 and 151 that are located on the sides of a sense amplifier 122. The memory cell C4 is connected to a bit line 153 that is connected to another sense amplifier 122. However, the memory cells C1 and C2 are connected to dummy bit lines 133_1 and 133_2 that are connected to a voltage controller 290. In FIG. 4, defects that may occur between two memory cells or bit lines are designated by reference characters R1 and R2.

During a test mode, the voltage controller 290 can replace voltages VCON1 and VCON2, which are applied to the dummy bit lines 133_1 and 133_2, with a first variable control voltage and a second variable control voltage.

Figure 5A:
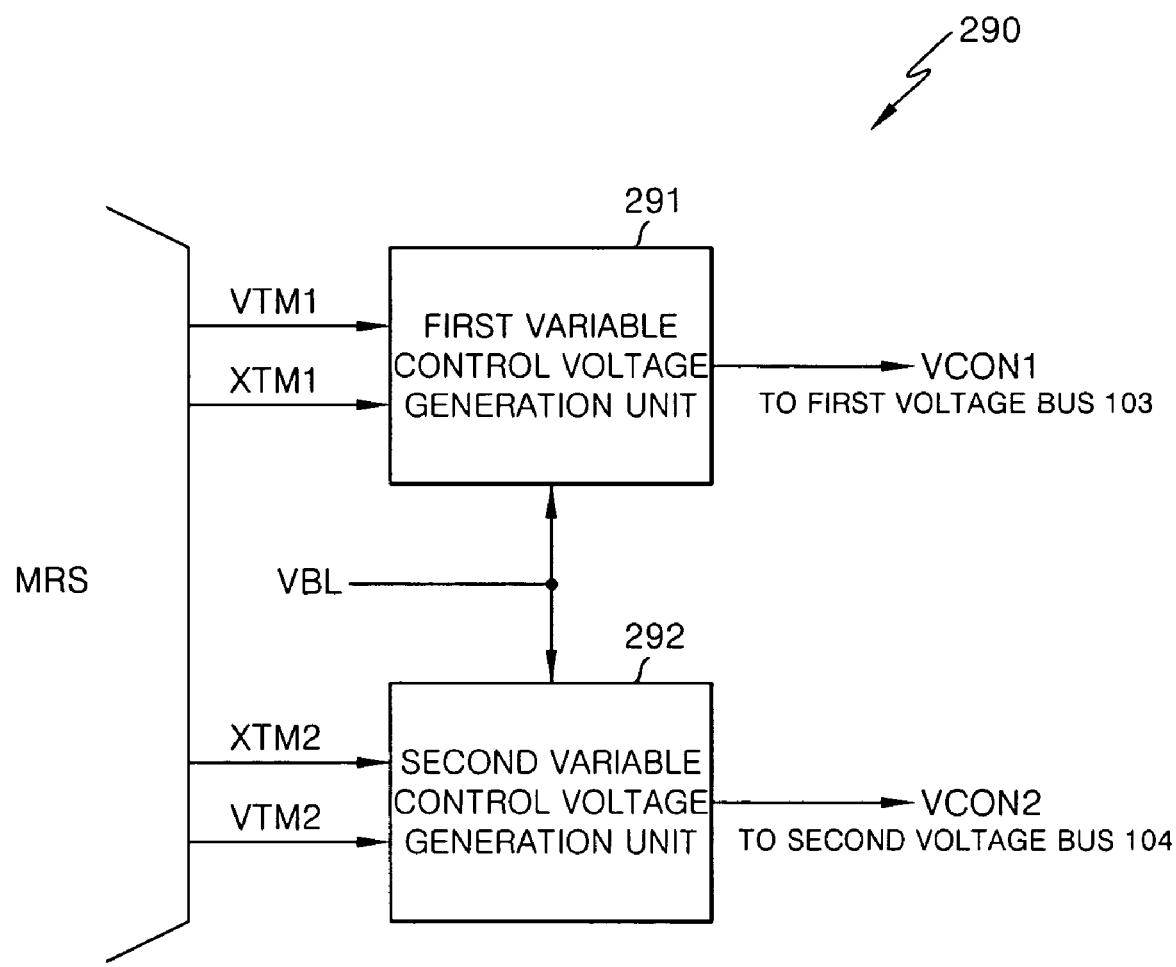
FIGS. 5a and 5b are a block diagram and a detailed circuit diagram, respectively, of an example of the voltage controller of FIG. 3.
Figure 5B:
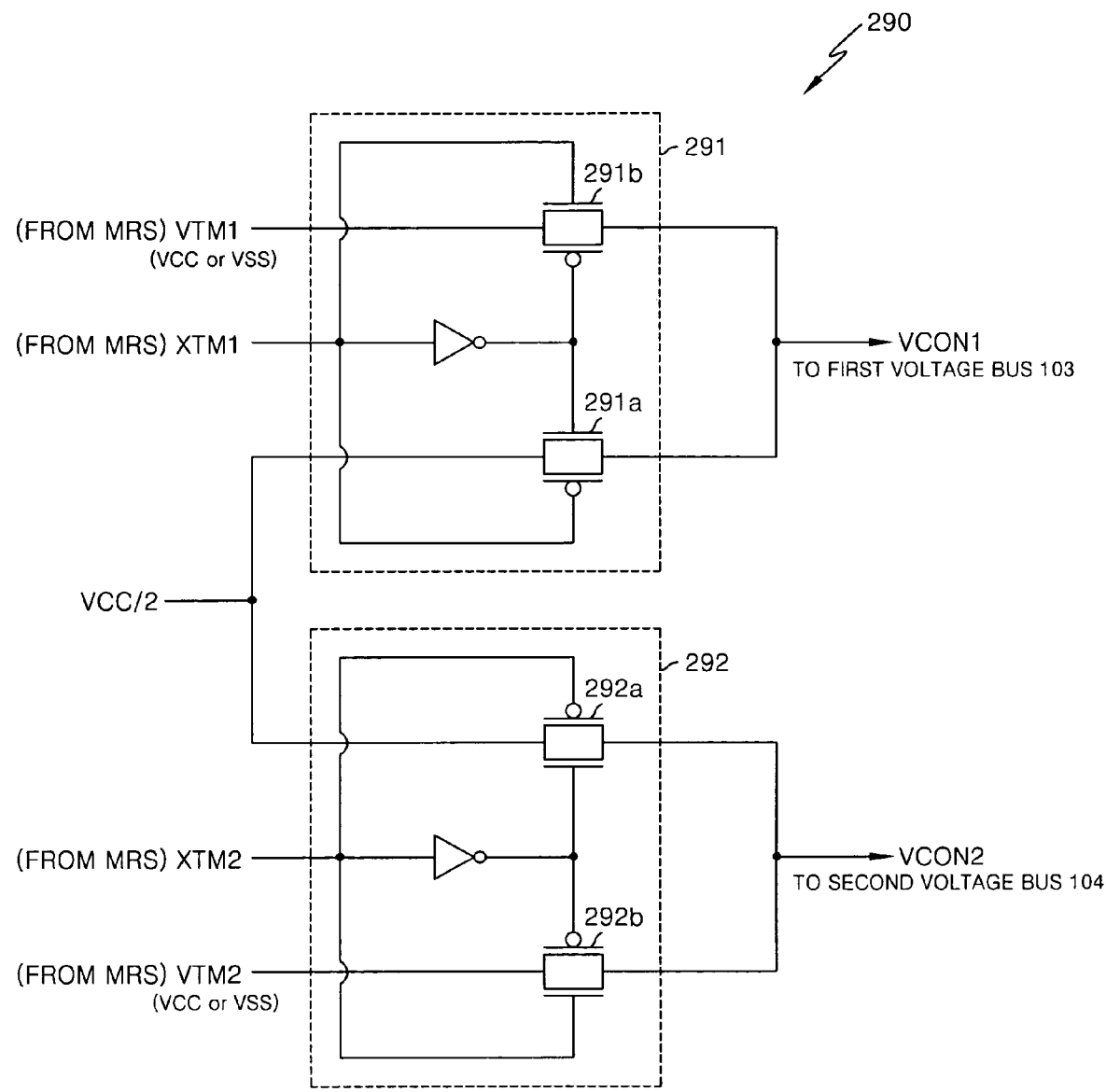

FIG. 5a and FIG. 5b are a block diagram and detailed circuit diagram, respectively, of an example of the voltage controller 290 of FIG. 3. The voltage controller 290 of FIG. 5a and FIG. 5b includes a first variable control voltage generation unit 291 for providing a voltage VCON1 and a second variable control voltage generation unit 292 for providing a voltage VCON2.

Referring to FIG. 5a and FIG. 5b, during a normal operation mode in which first and second test control signals XTM1 and XTM2 are in state "L", transmission gates 291a and 292a are turned on and the other transmission gates 291b and 292b are turned off. Accordingly, the voltages VCON1 and VCON2 are controlled to a fixed voltage, for example, VCC/2, so that the fixed voltage of VCC/2 is applied to the dummy bit lines.

In a test mode in which a first test control signal XTM1 and/or a second test control signal XTM2 are set to state "H", voltages VCON1 and VCON2 are replaced with first and second variable control voltages VTM1 and VTM2 that are provided by a mode register set MRS. The first and second variable control voltages VTM1 and VTM2 may independently be a supply voltage VCC or a ground voltage VSS. Accordingly, the voltages VCON1 and VCON2 can be independently controlled by the supply voltage VCC or ground voltage VSS. As a result, in the memory device, the memory cells or bit lines of the edge sub-arrays maybe fully stressed during a test.

Furthermore, in a test mode in which only one of the first test control signal XTM1 or the second test control signal XTM2 is in state "H", the voltage of the side that is controlled to state "L" is maintained at a fixed voltage of VCC/2.

As a result, in an embodiment that is implemented using the voltage controller 290 of FIG. 5a and FIG. 5b, various combinations of voltages may be provided to the dummy bit lines 133_1 and 133_2 that are adjacent to the normal bit lines 131 (refer to FIG. 3) included in the edge sub-array. For example, voltages VCON1 and VCON2 may be controlled to VCC and VSS, VCC and VCC/2, VSS and VCC/2, etc. As a result, for the edge sub-arrays 130, various tests can be conducted under the same conditions as those for the non-edge sub-arrays 150.

Figure 6A:
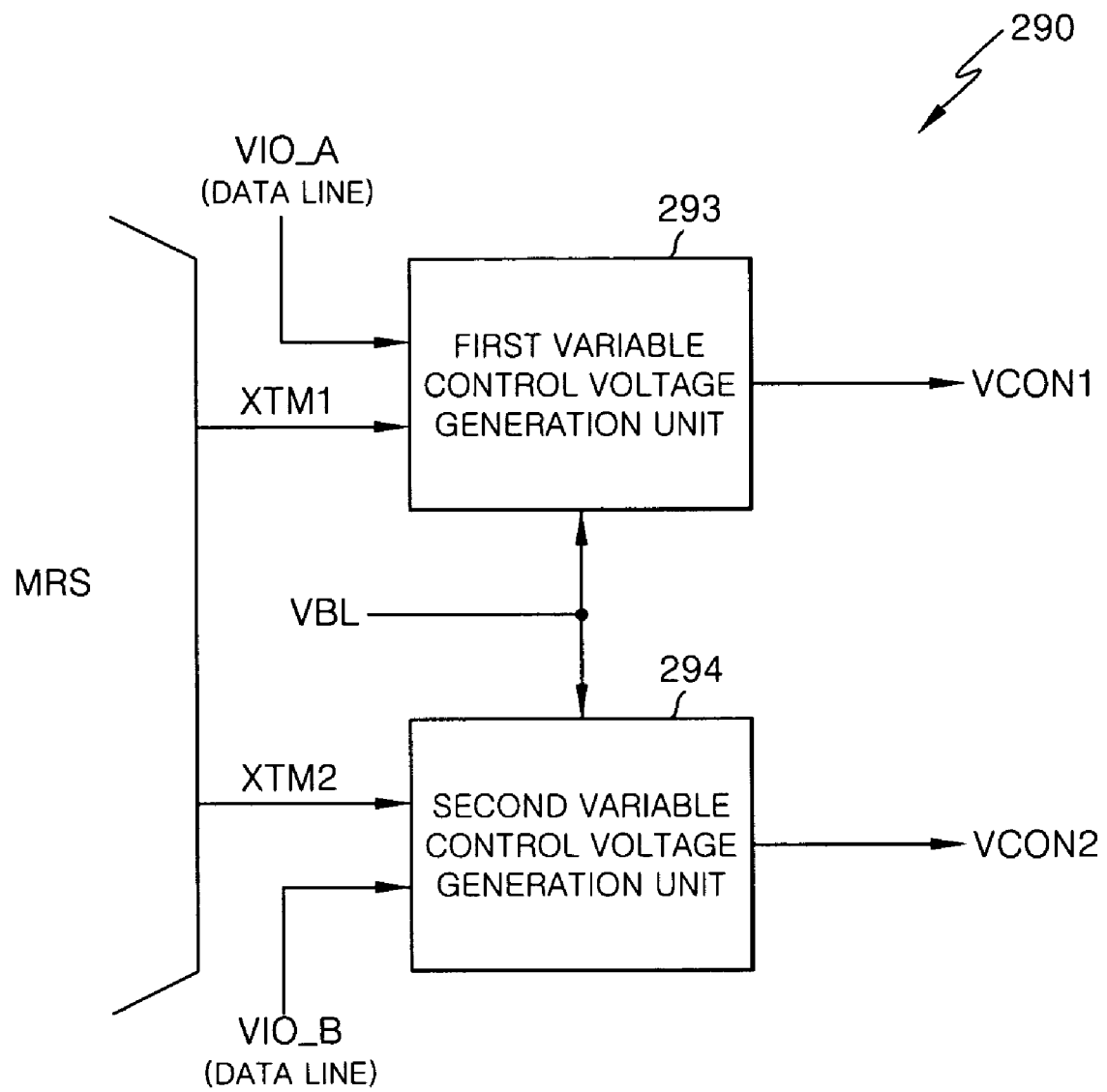
FIGS. 6a and 6b are a block diagram and a detailed circuit diagram, respectively, of another example of the voltage controller of FIG. 3.
Figure 6B:
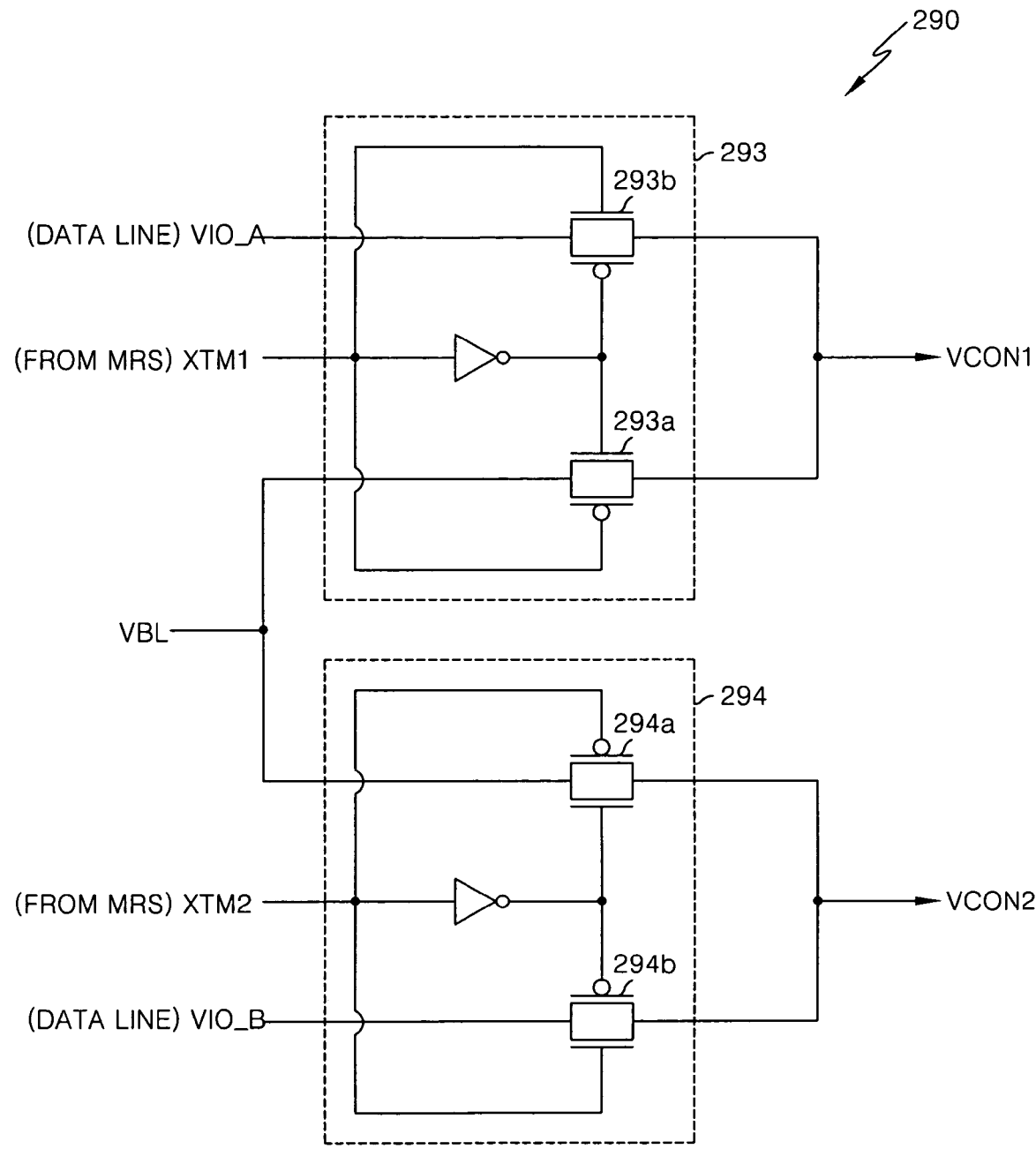

FIGS. 6a and 6b are a block diagram and detailed circuit diagram, respectively, of another example of the voltage controller 290 of FIG. 3. The voltage controller 290 of FIG. 6a and FIG. 6b is similar to the voltage controller 290 of FIG. 5a and FIG. 5b. The voltage controller 290 of FIG. 6a and FIG. 6b is different from the voltage controller 290 of FIG. 5a and FIG. 5b in that first and second variable control voltages VIO_A and VIO_B provided to a first variable control voltage generation unit 293 and a second variable control voltage generation unit 294 are not provided from a mode register set MRS but are provided from one of the data lines that transmit data input from the outside. Accordingly, the voltages VCON1 and VCON2 are voltages based on data that are input to the memory device 100 during the test mode.

Preferably, a data value provided to the bit line 153 of an adjacent non-edge sub-array 150 is also applied to the dummy bit line 133_1 positioned in the same column. Thus, in the memory device to which the voltage controller 290 of FIG. 6a and FIG. 6b is applied, tests can be performed on edge sub-arrays 130 under the same conditions as those for non-edge sub-arrays 150.

Figure 7:
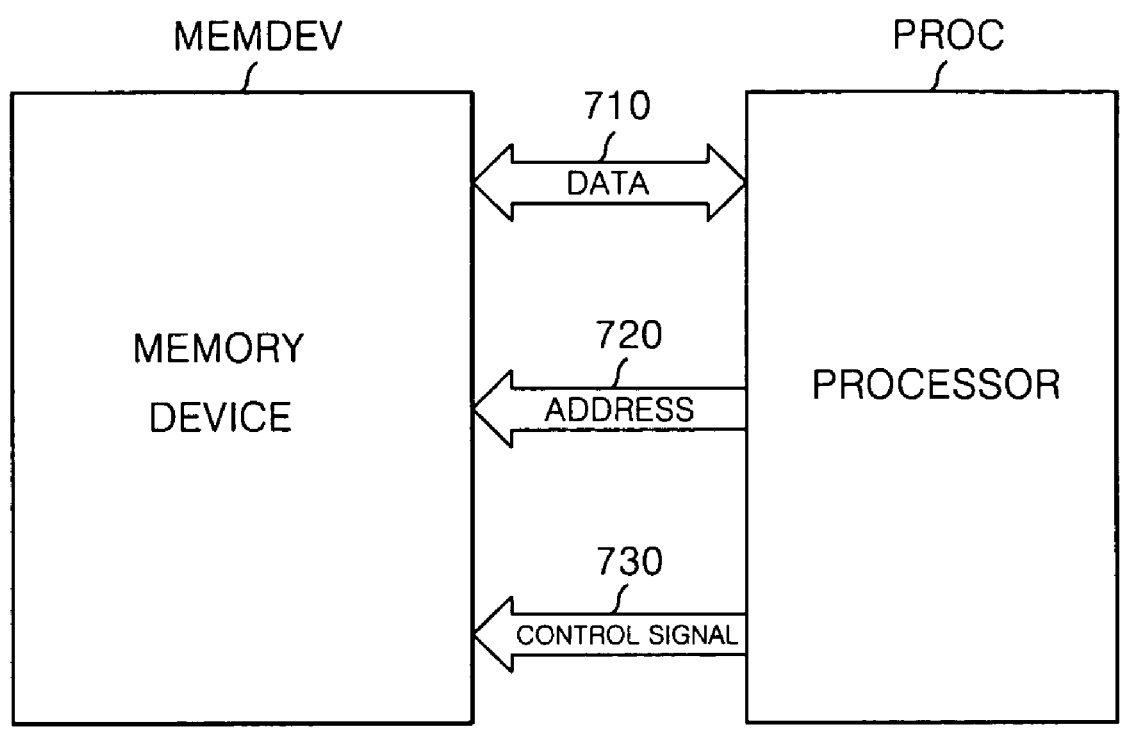
FIG. 7 is a diagram illustrating a system that includes a memory device according to an embodiment of the invention.

FIG. 7 illustrates a system that includes the memory device MEMDEV and a processor PROC. The memory device MEMDEV includes the memory device 100 described in conjunction with FIG. 2. The processor PROC may be a microprocessor, a digital signal processor, an embedded processor, a micro-controller, or the like. The processor PROC and the memory device MEMDEV communicate with each other using address signals on lines 720, control signals on lines 730, and data signals on lines 710.

Another embodiment is a method of testing a memory device. A fixed voltage is applied to the dummy bit lines of the edge sub-arrays during a normal operation mode. However, during a test mode, the fixed voltage applied to the dummy bit lines is replaced with a voltage different from the fixed voltage. The different voltage is applied to at least one dummy bit line. The different voltage may be, for example, the supply voltage, the ground voltage, or the voltage applied to bit lines in the same column as the dummy bit lines. In this way, all of the sub-arrays can be equally tested.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device having an open bit line architecture, comprising:
   a plurality of dummy memory cells;
   a plurality of dummy bit lines connected to the dummy memory cells, the dummy bit lines to connect the dummy memory cells to a fixed voltage during a normal operation mode;
   a first voltage bus connected to a first subset of dummy bit lines, the first subset including at least one dummy bit line of the dummy bit lines;
   a second voltage bus connected to a second subset of dummy bit lines, the second subset including at least one dummy bit line of the dummy bit lines, each of the dummy bit lines connected to either the first or second voltage bus; and
   a voltage controller connected to the first voltage bus and the second voltage bus, the voltage controller to provide a first variable control voltage to a first subset of the dummy bit lines during a test mode and to provide a second variable control voltage to a second subset of the dummy bit lines during the test mode, at least one of the first variable control voltage and the second variable control voltage having a voltage level that is different from a voltage level of the fixed voltage.

2. The memory device as set forth in claim 1, wherein the first variable control voltage is a voltage selected from among a supply voltage and a ground voltage.

3. The memory device as set forth in claim 1, wherein the second variable control voltage is a voltage selected from among a supply voltage and a ground voltage.

4. The memory device as set forth in claim 1, wherein the first variable control voltage and the second variable control voltage are different from each other.

5. The memory device as set forth in claim 1, wherein the first variable control voltage is a voltage based on a signal on a first data line of the memory device during the test mode.

6. The memory device as set forth in claim 5, wherein the second variable control voltage is a voltage based on a signal on a second data line of the memory device during the test mode.

7. The memory device as set forth in claim 1, further comprising a plurality of normal memory cells, the normal and dummy memory cells grouped into a plurality of sub-arrays, the sub-arrays arranged in a single direction between a first edge and a second edge of a memory array of the memory device, and the dummy memory cells located in the sub-arrays located at the first and second edges.

8. A memory device having an open bit line architecture, comprising:
   a plurality of sub-arrays including a plurality of non-edge sub-arrays and a plurality of edge sub-arrays, the non-edge sub-arrays and the edge sub-arrays each having a plurality of bit lines, the bit lines of the edge sub-arrays having a plurality of normal bit lines and a plurality of dummy bit lines interleaved with each other;
   a first voltage bus connected to at least one dummy bit line of the dummy bit lines of the edge sub-arrays;
   a second voltage bus connected to at least one dummy bit line of the dummy bit lines of the edge sub-arrays, each of the dummy bit lines of an edge sub-array of the edge sub-arrays connected to either the first or second voltage bus; and
   a voltage controller connected to the first and second voltage buses, the voltage controller to provide a first variable control voltage and a second variable control voltage to the first voltage bus and the second voltage bus, respectively, during a test mode, at least one of the first and second variable control voltages having a voltage different from the fixed voltage.

9. The memory device as set forth in claim 8, wherein the first variable control voltage is a voltage selected from among a supply voltage and a ground voltage.

10. The memory device as set forth in claim 9, wherein the second variable control voltage is a voltage selected from among a supply voltage and a ground voltage.

11. The memory device as set forth in claim 8, wherein the first variable control voltage and the second variable control voltage are different from each other.

12. The memory device as set forth in claim 8, wherein the first variable control voltage is a voltage based on a signal on a first data line of the memory device.

13. The memory device as set forth in claim 12, wherein the second variable control voltage is a voltage based on a signal on a second data line of the memory device.

14. A method of testing a memory device having an open bit line architecture, the memory device including a plurality of memory cells arranged in a plurality of sub-arrays, each sub-array including a plurality of dummy bit lines, the method comprising:
  disconnecting a fixed voltage from a first voltage bus and a second voltage bus, the first voltage bus coupled to a first plurality of the dummy bit lines and the second voltage bus coupled to a second plurality of dummy bit lines; and
  providing a first variable control voltage and a second variable control voltage to the first and second voltage buses, respectively, where at least one of the first variable control voltage and the second variable control voltage is different from the fixed voltage.

15. The method as set forth in claim 14, wherein the first variable control voltage is a voltage selected from among the supply voltage and the ground voltage.

16. The method as set forth in claim 14, wherein the second variable control voltage is a voltage selected from among the supply voltage and the ground voltage.

17. The method as set forth in claim 14, wherein the first variable control voltage and the second variable control voltage are different from each other.

18. The method as set forth in claim 14, wherein the first variable control voltage is a voltage based on a signal on a first data line of the memory device during a test mode.

19. The method as set forth in claim 18, wherein the second variable control voltage is a voltage based on a signal on a second data line of the memory device during a test mode.

20. A method of testing a memory device having an open bit line architecture, comprising:
  disconnecting a fixed voltage from a plurality of dummy bit lines;
  connecting a first variable control voltage to a first subset of the dummy bit lines through a first voltage bus; and
  connecting a second variable control voltage to a second subset of the dummy bit lines through a second voltage bus, where at least one of the first variable control voltage and the second variable control voltage is not equal to the fixed voltage.

21. The method of claim 20 wherein the disconnecting and connecting is in response to a test mode signal.

22. The method of claim 20 wherein the dummy bit lines are bit lines of sub-arrays of memory cells at edges of a memory array.

23. The memory device of claim 8, wherein for each normal bit line with a first adjacent dummy bit line and a second adjacent dummy bit line, the first adjacent dummy bit line is coupled to the first voltage bus and the second adjacent dummy bit line is coupled to the second voltage bus.

* * * * *